(12) United States Patent
Toyota et al.

(10) Patent No.: US 7,217,662 B2
(45) Date of Patent: May 15, 2007

(54) METHOD OF PROCESSING A SUBSTRATE

(75) Inventors: Gen Toyota, Yokohama (JP); Atsushi Shigeta, Fujisawa (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 11/088,199

(22) Filed: Mar. 24, 2005

(65) Prior Publication Data
US 2005/0221615 A1  Oct. 6, 2005

(30) Foreign Application Priority Data
Mar. 24, 2004  (JP) ............... 2004-087417

(51) Int. Cl.
*H01L 21/461* (2006.01)
*H01L 21/302* (2006.01)

(52) U.S. Cl. ............... 438/690; 257/E21.237
(58) Field of Classification Search ........... 438/692, 438/701, 690, 747, 696; 257/E21.237
See application file for complete search history.

(56) References Cited

U.S. PATENT DOCUMENTS

| | | | | |
|---|---|---|---|---|
| 5,514,025 A * | 5/1996 | Hasegawa et al. | ............ | 451/44 |
| 5,690,540 A * | 11/1997 | Elliott et al. | ............ | 451/41 |
| 6,010,964 A * | 1/2000 | Glass | ............ | 438/692 |
| 6,361,708 B1* | 3/2002 | Kubo et al. | ............ | 216/88 |
| 6,921,455 B1* | 7/2005 | Nakano et al. | ............ | 156/345.11 |
| 2001/0051432 A1 | 12/2001 | Yano et al. | | |
| 2002/0028581 A1* | 3/2002 | Yasui et al. | ............ | 438/689 |
| 2003/0110803 A1* | 6/2003 | Saito et al. | ............ | 65/30.14 |
| 2004/0098924 A1* | 5/2004 | Iwasa | ............ | 51/302 |
| 2004/0106363 A1 | 6/2004 | Ishii et al. | | |
| 2005/0227591 A1* | 10/2005 | Encomoto et al. | ............ | 451/41 |
| 2005/0245174 A1* | 11/2005 | Toyota et al. | ............ | 451/41 |

FOREIGN PATENT DOCUMENTS

| | | |
|---|---|---|
| CN | 1421903 A | 6/2003 |
| CN | 1468446 A | 1/2004 |
| JP | 06-097142 | 4/1994 |
| JP | 10-242090 | 9/1998 |
| JP | 2003-109931 | 4/2003 |
| JP | 2003-234314 | 8/2003 |

* cited by examiner

*Primary Examiner*—Asok Kumar Sarkar
(74) *Attorney, Agent, or Firm*—Finnegan, Henderson, Farabow, Garrett & Dunner, L.L.P.

(57) ABSTRACT

There is disclosed a method of processing a substrate, which comprises applying a surfactant or a water soluble polymer agent onto a surface of a substrate to be processed, and sliding a circumferential portion of the substrate and a polishing member against each other to polish the circumferential portion of the substrate.

18 Claims, 6 Drawing Sheets

METHOD OF PROCESSING A SUBSTRATE

CROSS-REFERENCE TO RELATED APPLICATIONS

This application is based upon and claims the benefit of priority from prior Japanese Patent Application No. 2004-087417, filed Mar. 24, 2004, the entire contents of which are incorporated herein by reference.

BACKGROUND OF THE INVENTION

1. Field of the Invention

The present invention relates to a method of processing a substrate for removing surface roughness that occurs on a circumferential portion (bevel portion and edge portion) of a substrate to be processed, such as a semiconductor wafer, and films that adhere to the circumferential portion of the substrate to be processed to become stain sources.

2. Description of the Related Art

In recent years, along with the miniaturization of semiconductor elements and the high packing density of semiconductor devices, management of particles has become more important. As one of the big problems in managing particles, there is the problem of dust occurrence arising from surface roughness that occurs on bevel portion and edge portion of a semiconductor wafer (semiconductor substrate) in processes of manufacturing a semiconductor device. Herein, the bevel portion means a wafer portion having a slanted cross section at an end portion of the semiconductor wafer, and the edge portion means a flat surface wafer portion of around several millimeters from the bevel portion toward the internal side of the wafer.

For example, in a reactive ion etching (RIE) step of forming trenches (deep trenches) of a trench capacitor on a surface of an Si wafer, a by-product generated in etching adheres to the bevel portion and the edge portion of the wafer. Then, because this by-product works as an etching mask, thorn-shaped protrusions are likely to be formed on the bevel portion and the edge portion of the wafer (protrusions shown by reference numeral 25 in FIG. 3). In particular, when attempt is made to form an extremely large deep trench whose opening diameter is of a sub micron order, and whose aspect ratio is several tens, the above-mentioned thorn-shaped protrusions are apt to occur at the circumferential portion due to its process conditions.

Although the height of thorn-shaped protrusions varies with their positions on the wafer, it becomes nearly 10 μm at maximum, and these protrusions are broken at the time of transfer or processes of the wafer, and become causes of particles. Since such particles lead to the decrease of the yield of a semiconductor device to be manufactured, it is necessary to remove the thorn-shaped protrusions formed on the bevel portion and edge portion.

Conventionally, in order to remove such thorn-shaped protrusions and the likes, a chemical dry etching (CDE) method is employed. However, since the CDE method is of isotropic etching, and therefore, even if low thorn-shaped protrusions are removed completely, high thorn-shaped protrusions can not completely be removed, and some thereof are left unremoved. As a consequence, concaves and convexes according to the uneven height of the thorn-shaped protrusions are inevitably formed on the wafer. Dust easily collects in these concaves and convexes at the time of machine processing such as chemical mechanical polishing (CMP) to be carried out in later processes, which becomes a problem. Further, the processing time required for the CDE process per wafer is as long as normally 5 minutes or more. Accordingly, the CDE process leads to decline the throughput, and also increases raw material costs, which is a problem.

Further, in processes of manufacturing a semiconductor device, raw material films adhering to bevel portion and edge portion of a wafer become sources of stain. Therefore, it is required to remove the material films, however, in the CDE method, it is difficult to easily remove the material films.

Recently, in order to remove surface roughness that occurred on a circumferential portion of a wafer and films that adhere to the circumferential portion to become stain sources, a method of polishing the circumferential portion is carried out (as disclosed in, for example, Jpn. Pat. Appln. KOKAI Publication No. 2003-234314). In this method, a wafer is rotated and also a polishing member such as a polishing tape is contacted to a side surface of the wafer, thereby polishing the circumferential portion of the wafer. In this manner, it is possible to remove surface roughness that occurs on the circumferential portion of the wafer and films that adhere to the circumferential portion to become stain sources, in a short time.

However, this kind of method has the following problem. Namely, when a substrate side surface is polished, fine Si particles of the main component of the substrate, polishing particles of the polishing tape and the like scatter. Especially, when the substrate surface is hydrophobic, these particles adhere firmly to the surface. Therefore, even if physical cleaning of the substrate surface is carried out after completion of polishing process, particles can hardly be removed. Consequently, there is a problem on reliability of a semiconductor device to be manufactured. Furthermore, the method leads to the decline in yield.

SUMMARY OF THE INVENTION

According to an aspect of the present invention, there is provided a method of processing a substrate, comprising:

applying a surfactant or a water soluble polymer agent onto a surface of a substrate to be processed; and sliding a circumferential portion of the substrate and a polishing member against each other to polish the circumferential portion of the substrate.

According to another aspect of the present invention, there is provided a method of processing a substrate in which a polishing member is contacted and pressed onto a circumferential portion of a substrate to be processed, while the substrate is rotated by rotating a substrate holding portion which holds the substrate thereon, and pure water or chemical solution is supplied onto a contact portion between the circumferential portion of the substrate and the polishing member, to polish the circumferential portion of the substrate, the method comprising:

applying a surfactant or a water soluble polymer agent onto a surface of the substrate to be processed in advance.

According to a further aspect of the present invention, there is provided a program of processing a substrate readable and executable by a computer, comprising:

applying a surfactant or a water soluble polymer agent onto a surface of a substrate to be processed; and sliding a circumferential portion of the substrate and a polishing member against each other to polish the circumferential portion of the substrate.

DETAILED DESCRIPTION OF THE INVENTION

An embodiment of the present invention will be explained by reference to the accompanying drawings.

[Embodiment]

Figure 1:
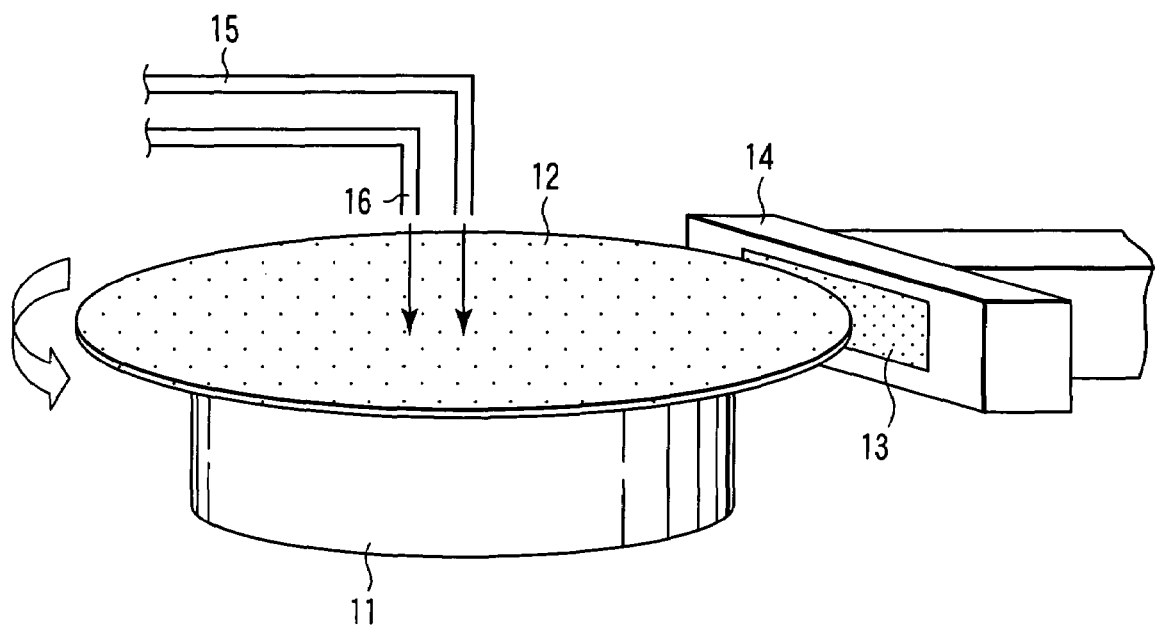
FIG. 1 is a schematic perspective view showing a configuration of a polishing device for use in substrate processing by a substrate processing method according to an embodiment of the present invention.

FIG. 1 is a schematic perspective view showing a configuration of a polishing device for use in substrate processing by a substrate processing method according to an embodiment of the present invention.

In FIG. 1, reference numeral 11 is a substrate holding portion capable of rotational movement as one of plane movements. A substrate 12 to be processed, such as a semiconductor wafer, is held on the substrate holding portion 11. The substrate holding portion 11 is driven by a motor, not shown, to rotate with a vertical axis at its rotational center. The diameter of the substrate holding portion 11 is smaller than that of the substrate 12, and therefore, a circumferential portion of the substrate 12 protrudes outward from the substrate holding portion 11.

A polishing tape 13, that is used for polishing the circumferential portion of the substrate 12, is attached to a polishing head 14 that is movable in the horizontal direction (the direction perpendicular to a rotating axis of the substrate holding portion 11). When the polishing head 14 is moved to the substrate 12 side, the polishing tape 13 is contacted and pressed onto a side surface of the substrate 12.

Further, reference numeral 15 in FIG. 1 is a pure water supply nozzle for supplying pure water onto the substrate 12. Pure water is dripped onto the center of the surface of the rotating substrate 12, whereby pure water is supplied to the contact portion between the substrate 12 and the polishing tape 13 by centrifugal force generated by the rotation. A polishing solution may be also employed, in the place of pure water.

In addition, reference numeral 16 in FIG. 1 is a surfactant supply nozzle for supplying surfactant onto the substrate 12. Chemical solution including a surfactant is dripped onto the center of the surface of the substrate 12, and the substrate 12 is rotated, whereby, a surfactant is supplied onto the entire surface of the substrate 12 by centrifugal force generated by the rotation. By the supply of the surfactant, the surfactant is coated onto the substrate surface. Water soluble polymer agents may be also employed, in the place of the surfactant.

A polishing surface of the polishing tape 13 is made of, for example, a thin PET film of about several microns to several hundreds of microns in thickness. Diamond abrasive or SiC, for example, is adhered on the polishing surface of the polishing tape 13 by an urethane type adhesive. Abrasives to be adhered onto the polishing tape 13 are selected according to the kinds of substrates to be processed and required performances thereof, and for example, diamond with the particle size of #2000 to #30000 and SiC with the particle size of #2000 to #20000 may be employed.

Examples of the surfactant include anion system surfactants: polycarboxylic acid system (for example, polycarboxylic acid ammonium), polyacrylic acid system (for example, polyacrylic acid ammonium), alkyl benzene sulphonate system (for example, potassium dodecylbenzene sulphonate), cation system surfactants: polyethylene imine system, quaternary ammonium salt (polydialkyl ammonium chloride), nonion system surfactants: acetylene diole system, polyoxyethylene alkyl ether, and polyvinyl pyrrolidone.

Examples of the water soluble polymer agent include cellulose systems (methyl cellulose, methyl hydroxyethyl cellulose, methyl hydroxypropyl cellulose, hydroxyethyl cellulose, hydroxypropyl cellulose, carboxymethyl cellulose, carboxyethyl cellulose, carboxymethyl hydroxyethyl cellulose), and chitosan groups.

These solutions may be selected appropriately according to the characteristics of the surface of the substrate to be processed and the characteristics of particles to become stain sources. As described later herein, when resist is applied onto the substrate surface, cellulose system, acetylene diol system, and alkyl benzene sulfonic acid system are effective for hydrophilic property of resist, and these may be selected appropriately.

Next, a substrate processing method by use of the polishing device having the above configuration will be explained by reference to FIGS. 2 to 6. Herein, a method is explained in which deep trenches of a trench capacitor are formed in a surface of a semiconductor wafer (Si wafer) by an RIE method, and roughness that occurs on a surface of a circumferential portion (bevel portion and edge portion) of the wafer at this moment is removed. The trench capacitor is used in, for example, a DRAM cell.

Figure 2:
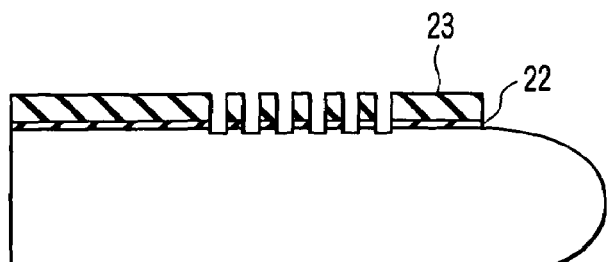
FIG. 2 is a cross sectional view showing a substrate structure in a step of a substrate processing method according to the embodiment of the present invention, for explaining the substrate processing method.

First, as shown in FIG. 2, a hard mask composed of laminated films of an $SiO_2$ film 22 and an SiN film 23 is formed on an Si wafer 21. Herein, the thickness of the $SiO_2$ film 22 is, for example, 90 nm, and the thickness of the SiN film 23 is, for example, 200 nm.

Figure 3:
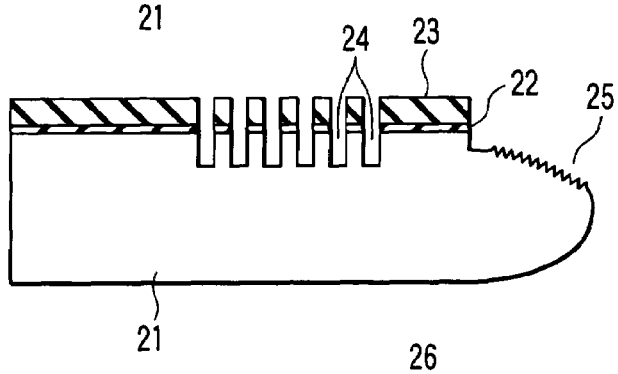
FIG. 3 is a cross sectional view showing a substrate structure in a step following the step of FIG. 2 of a substrate processing method according to the embodiment of the present invention, for explaining the substrate processing method.

Next, as shown in FIG. 3, with the hard mask as a mask, the Si wafer 21 is etched by the RIE method, and deep trenches 34 are formed in the Si wafer 21. For example, the opening diameter of the deep trenches is 0.25 µm, and the depth thereof is 7 µm. By the RIE process, thorn-shaped protrusions 25 are formed on a surface of a circumferential portion of the Si wafer 21.

In more details, a by-product generated in the etching adheres to the bevel portion and the edge portion of the Si wafer 21. Then, because this by-product works as an etching mask, thorn-shaped protrusions are formed on the bevel portion and the edge portion of the Si wafer 21. In particular, when attempt is made to form an extremely large deep trench 24 whose opening diameter is of a sub micron order, and whose aspect ratio is several tens, the thorn-shaped protrusions 25 are apt to occur at the bevel portion and the edge portion due to its process conditions. In the present embodiment, the thorn-shaped protrusions 25 are removed by using the polishing device mentioned above.

Figure 4:
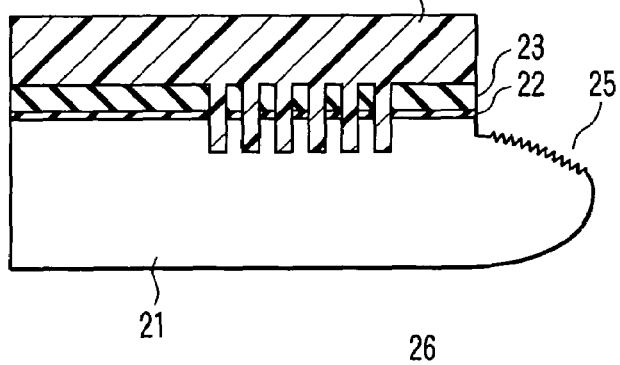
FIG. 4 is a cross sectional view showing a substrate structure in a step following the step of FIG. 3 of a substrate processing method according to the embodiment of the present invention, for explaining the substrate processing method.

Before polishing, for the purpose of protection of the substrate surface, a resist 26 is applied onto the Si wafer 21 except the bevel portion and the edge portion as shown in FIG. 4. The material of the resist 26 is, for example, an aromatic azido compound, or an aromatic diazido compound, and formation of the resist 26 makes the substrate surface hydrophobic. The resist 26 also has a function of preventing polishing particles and Si particles generated by polishing, as described later, from entering the trenches 24.

The structure shown in FIG. 4 is used as the substrate 12 to be processed, and the substrate 12 is held on the substrate holding portion 11 of the polishing device shown in FIG. 1. Then, the substrate holding portion 11 to which the substrate 12 is held is rotated, and a surfactant is dripped from the surfactant supply nozzle 16 onto the center of the substrate surface. Alternatively, after the surfactant is dripped from the surfactant supply nozzle 16 onto the center of the substrate surface, the substrate holding portion 11 having held thereon the substrate 12 is rotated. In this manner, the surfactant is supplied onto the entire surface of the substrate by centrifugal generated by the rotation of the substrate holding portion 11, and coating of surfactant is applied onto the substrate surface.

Next, the polishing head 14 is moved to the sidewall of the substrate 12, and the polishing head 14 is pressed onto the substrate 12 such that the bevel portion of the substrate 12 are pinched by the polishing tape 13 of the polishing head 14 from the above and the below by deflection of the polishing tape 13. By this pinching process, the area of several millimeters at the edge portion of the device formation surface may be made into a polishing area. Then, by rotating the substrate holding portion 11, the substrate 12 is rotated, and the bevel portion and the edge portion of the substrate 12 and the polishing tape 13 of the polishing head 14 are slid, thereby polishing the bevel portion and the edge portion of the substrate 12.

At this polishing process, pure water is continuously dripped from the pure water supply nozzle 15 onto the center of the surface of the substrate 12, and the pure water is guided toward the outer side on the surface of the substrate 12 by centrifugal force of the rotation of the substrate holding portion 11, and guided to the contact portion between the circumferential portion of the substrate 12 and the polishing tape 13. In the case where it is supposed that the coating effect of the surfactant is weakened by the pure water supply to the substrate surface, the surfactant may be dripped from the surfactant supply nozzle 16 during the polishing process. In this case, the surfactant may be dripped continuously, or intermittently at a certain interval.

Figure 5:
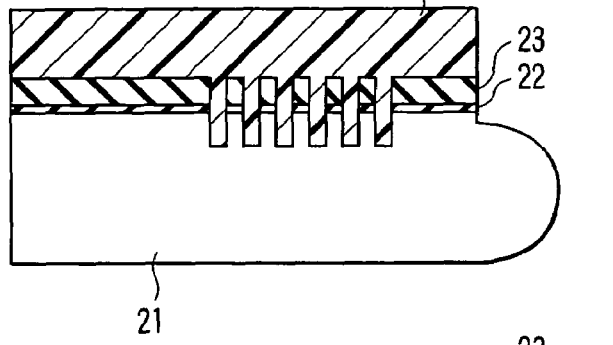
FIG. 5 is a cross sectional view showing a substrate structure in a step following the step of FIG. 4 of a substrate processing method according to the embodiment of the present invention, for explaining the substrate processing method.

Through the above polishing process, as shown in FIG. 5, there is no protrusion on the circumferential portion of the Si wafer 21, and a flat surface is obtained.

Figure 6:
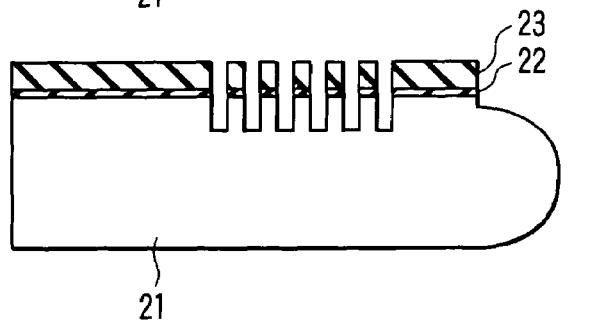
FIG. 6 is a cross sectional view showing a substrate structure in a step following the step of FIG. 5 of a substrate processing method according to the embodiment of the present invention, for explaining the substrate processing method.

After the polishing ends, a physical cleaning process such as brush scrubbing or ultrasonic cleaning is carried out to the substrate surface to remove particles and other extraneous matters adhering to the surface of the resist 26. In the case of the present embodiment, because the substrate surface is protected by the resist 26, the particles and other extraneous matters adhering to the surface of the resist 36 may be removed by use of chemical etching in the place of the physical cleaning process. Thereafter, as shown in FIG. 6, the resist 26 is removed by an ashing process using oxygen gas or the like.

Figure 7:
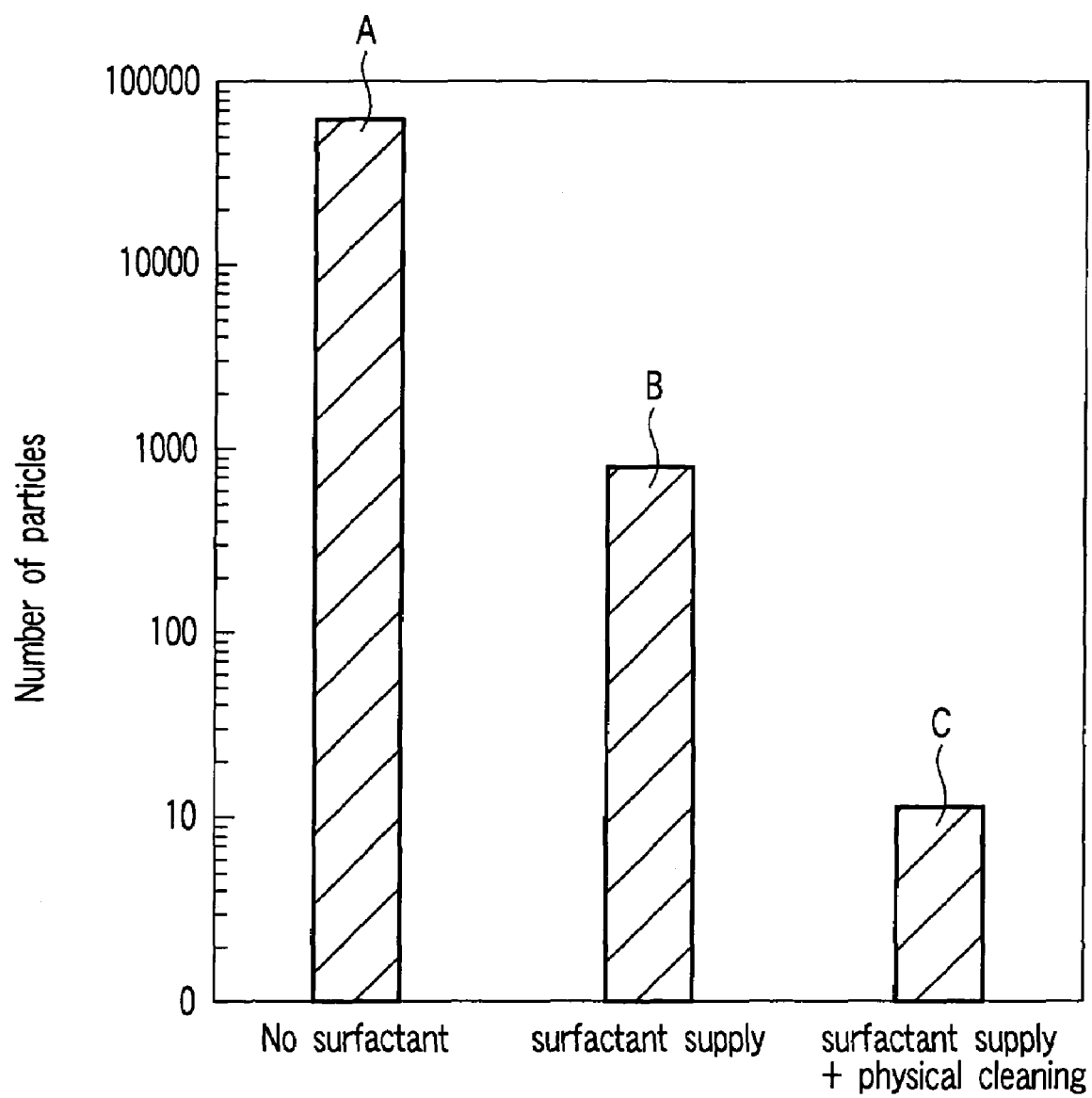
FIG. 7 is a characteristic chart showing decreasing effects of residual particles on a substrate by use of the substrate processing method according to the embodiment of the present invention.

FIG. 7 is a graph showing decreasing effects of residual particles on a substrate by use of a surfactant in polishing the bevel portion.

In the case where the bevel portion were polished without supplying the surfactant, the number of particles residual on the resist surface after polishing was confirmed to be tens of thousands as shown in by reference character A in FIG. 7. On the contrary, in the case where the bevel portion were polished after a coating process by the surfactant as explained in the present embodiment, the number of particles residual on the resist surface after polishing was decreased to below 1000, as shown by reference character B in FIG. 7. Further, as explained in the embodiment, by adding a physical cleaning process after the polishing process, the number of particles residual on the resist surface after polishing was greatly decreased to around 10, as shown reference character by C in FIG. 7. According to the conventional method, even when a physical cleaning process was added after polishing process, the number of particles was hardly decreased.

According to the embodiment, with respect to an Si wafer 21 on which deep trenches of a trench capacitor are formed by a RIE method, as a previous step of process of polishing the circumferential portion thereof, the surfactant is supplied on the substrate surface and coating thereof is carried out, thereby, it is possible to prevent particles from firmly adhering onto the substrate surface during polishing process. As a consequence, particles may be easily removed from the substrate surface by a physical cleaning process after polishing process, and accordingly, it is possible to make the substrate surface free of particles, or nearly free thereof. Therefore, it is possible to improve the reliability and yield of a semiconductor device to be manufactured.

Further, since the bevel portion and the edge portion of the wafer 21 after removal of the thorn-shaped protrusions 25 become flat surfaces, the problems with the CDE method mentioned previously are solved. Namely, when the CDE method is employed so as to remove the thorn-shaped protrusions 25 on the bevel portion and the edge portion, concaves and convexes according to the uneven height of the thorn-shaped protrusions are formed on the bevel portion and the edge portion, and dust easily collects in thee concaves and convexes in machine processing such as CMP to be carried out in later processes, which becomes a problem. However, according to the present embodiment, since the concaves and convexes are not formed, the prior art problem is solved.

Furthermore, the polishing device used in the embodiment is extremely simple, and therefore, it is possible to make the cost of the device itself low. Further, since the materials to be used are only pure water and surfactant, it is possible to reduce the running costs significantly. As explained above, according to the embodiment, a great advantage can be attained in the viewpoint of cost reduction.

Moreover, if films that adhere to the circumferential portion and the like of the substrate to become stain sources are removed by a polishing process using a polishing tape, the above removal may be realized in a single process. Therefore, it is possible to remove the films that become stain sources in a shorter time in comparison with the conventional wet etching method, and also to improve the throughput.

[Modified Embodiments]

The present invention is not limited to the embodiment described above. In the above embodiment, the substrate circumferential portion is polished by sliding action of the polishing tape attached to the polishing head. However, a polishing member such as a fixed-abrasive pad formed by fixing an abrasive with a binder may be used, instead. Further, it is possible to employ a polishing cloth as a polishing member in the place of the polishing tape and to supply a polishing solution containing polishing abrasives in place of pure water, to polish the substrate circumferential portion. Moreover, the present invention is applicable to polish a cutout portion, i.e., a so-called notch portion, formed at a portion of the wafer circumferential portion as an alignment mark for use in aligning a mask and the wafer and also as a crystal orientation determining mark to determine a crystal orientation on the main surface of the wafer.

In the embodiment, the substrate holding portion having held thereon the substrate to be processed is rotated. However, the polishing head may be rotated, instead. Further, the substrate and the polishing head may be rotated in respectively reverse directions. Furthermore, the movement of the substrate holding portion and the polishing head is not necessarily limited to the rotational movement. Other movement may be employed so long as it is a plane movement. Still further, the number of the polishing heads is not limited to one. A plurality of polishing heads may be arranged along the circumferential portion of the substrate to be processed.

Furthermore, in the above embodiment, pure water or chemical solution such as polishing solution is dripped onto the center of the surface of the rotating substrate 12, whereby it is supplied to the contact portion between the substrate circumferential portion and the polishing member by centrifugal force. However, the pure water or the chemical solution such as the polishing solution may be directly supplied to the contact portion between the substrate circumferential portion and the polishing member. Specifically, pure water or chemical solution may be supplied onto the circumferential portion of the rotating substrate at upstream side in the sliding direction of the contact portion between the substrate circumferential portion and the polishing member.

In addition, the polishing head is made to be flexible, whereby it is possible to remove unevenness of pressure on the contact surface and make the polishing amount uniform. By giving flexibility to the polishing head, the polishing member may be contacted not only onto the bevel portion but also onto the edge portion, and therefore, the entire wafer circumferential portion can be polished uniformly. Furthermore, when the polishing head is inclined from the vertical surface, it is possible to sufficiently polish not only the bevel portion but also the edge portion of the wafer.

Further, in the above embodiments, an example in which the Si wafer is used as the substrate has been explained, however, in place thereof, semiconductor wafers such as an SOI wafer and an SiGe wafer may be employed. Further, an Si wafer whose device formation surface is formed of SiGe may be employed.

Furthermore, in the above embodiment, a resist is employed for the purpose of protection of the substrate surface. However, other organic films than a resist may be employed. In addition, after completion of polishing, it is not necessary to remove all of the organic film, but only part of the stained surface thereof may be removed, and the remaining portion of the organic film may be used as a protective film in the later processes.

Figure 8:
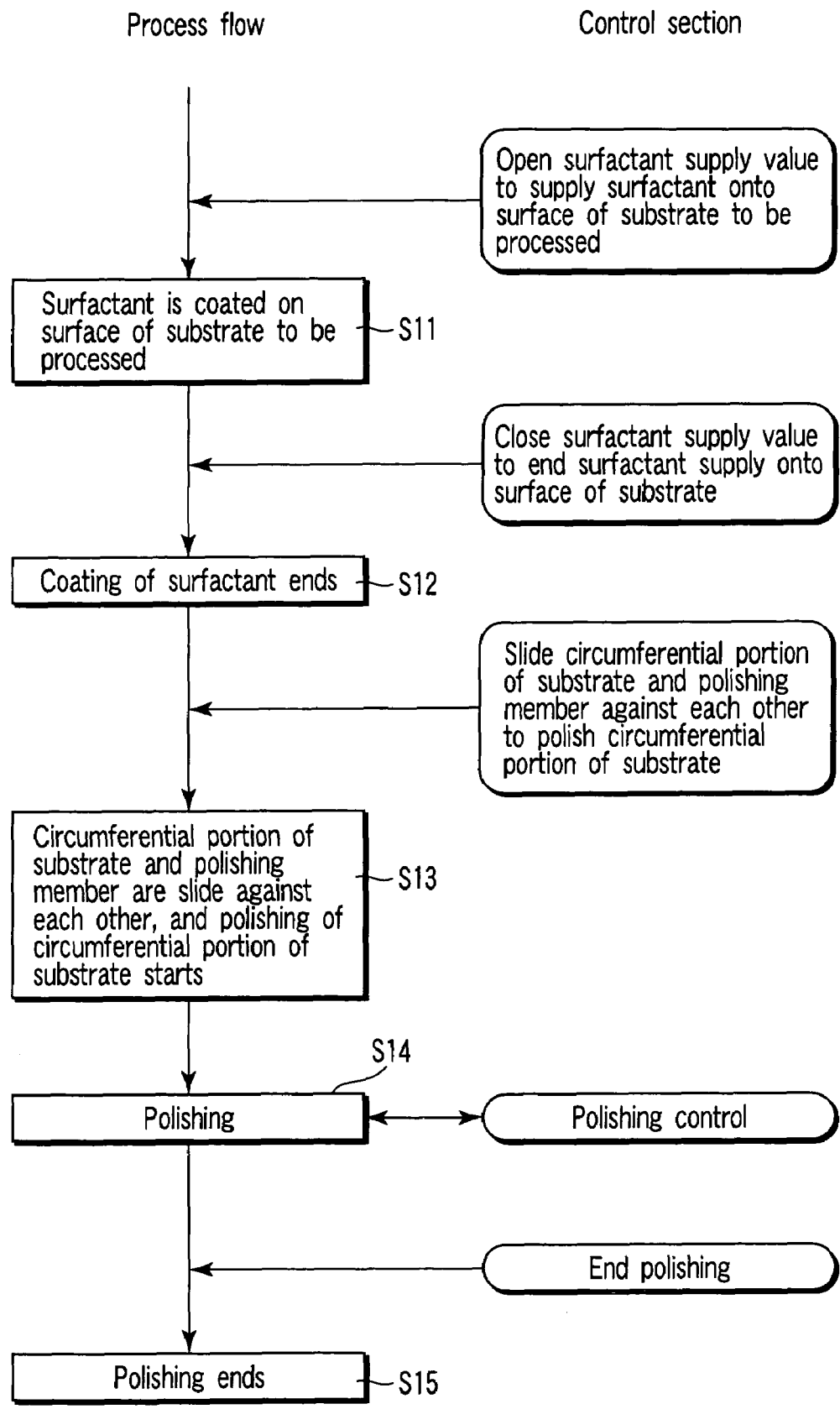
FIG. 8 is a flow chart of processing a substrate with instructions from a control section.

FIG. 8 is a flow chart of processing a substrate with instructions from a control section, i.e., a computer, which can read and execute a program of processing a substrate readable and executable by a computer, comprising applying a surfactant or a water soluble polymer agent onto a surface of a substrate to be processed, and sliding a circumferential portion of the substrate and a polishing member against each other to polish the circumferential portion of the substrate.

Specifically, as shown in the flow chart in FIG. 8, the control section issues an instruction for opening a surfactant supply valve to supply a surfactant onto a surface of a substrate to be processed. In accordance with the issuance of the surfactant supply instruction, the surfactant is supplied and coated onto the surface of the substrate (step S11). The flow rate and the supply time duration are controlled by the control section, and the control section issues a surfactant supply end instruction for closing the surfactant supply valve to end the supply of the surfactant onto the surface of the substrate. In accordance with the issuance of the surfactant supply end instruction, the supply of the surfactant onto the surface of the substrate ends (step S12). After that, the control section issues a slide instruction including the rotation of the substrate, the supply of processing pressure, the supply of the surfactant, the supply of pure water, etc. In accordance with the issuance of the slide instruction, a circumferential portion of the substrate and a polishing member are slide against each other, and polishing of the circumferential portion of the substrate starts (step S13). During the polishing (step S14), the number of rotations of the substrate, the processing pressure, the flow rate of the surfactant, the flow rate of pure water, the processing time, etc. are controlled by the control section, and the control section issues a polishing end instruction including end of the rotation of the substrate, end of the supply of processing pressure, end of the supply of the surfactant, end of the supply of pure water, etc. In accordance with the issuance of the polishing end instruction, polishing of the substrate ends (step S15). The surfactant may be replaced with a water soluble polymer agent. The pure water may be replaced with a chemical solution.

Figure 9:
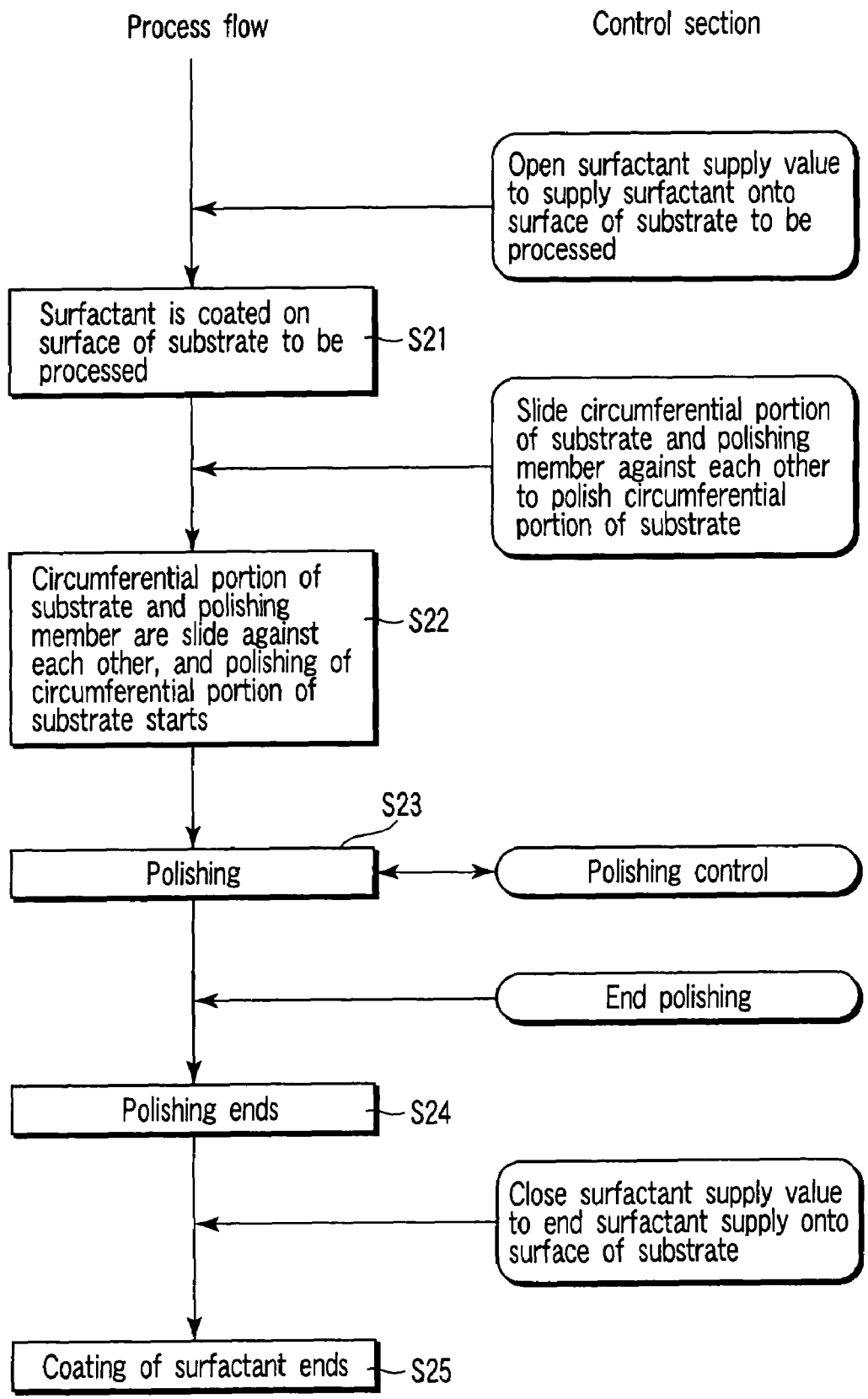
FIG. 9 is a flow chart of processing a substrate with instructions from a control section.

In the flow chart shown in FIG. 8, the surfactant is supplied and coated onto the surface of the substrate only before polishing the circumferential portion of the substrate. FIG. 9 shows a flow chart in which a surfactant is applied onto a surface of a substrate from before polishing the circumferential portion of the substrate until the end of the polishing. Specifically, the control section issues an instruction for opening a surfactant supply valve to supply a surfactant onto a surface of a substrate to be processed. In accordance with the issuance of the surfactant supply instruction, the surfactant is supplied and coated onto the surface of the substrate (step S21). The flow rate and the supply time duration of the surfactant are controlled by the control section, and the supply of the surfactant continues. Under this state, the control section issues a slide instruction including the rotation of the substrate, the supply of processing pressure, the supply of the surfactant, the supply of pure water, etc. In accordance with the issuance of the slide instruction, a circumferential portion of the substrate and a polishing member are slide against each other, and polish of the circumferential portion of the substrate starts (step S22). During the polishing (step S23), the number of rotations of the substrate, the processing pressure, the flow rate of the surfactant, the flow rate of pure water, the processing time, etc. are controlled by the control section, and the control section issues a polishing end instruction including end of the rotation of the substrate, end of the supply of processing pressure, end of the supply of pure water, etc. In accordance with the issuance of the polishing end instruction, polishing of the substrate ends (step 24). After the end of the polishing, the control section issues a surfactant supply end instruction for closing the surfactant supply valve to end the supply of the surfactant onto the surface of the substrate. In accordance with the issuance of the surfactant supply end instruction, the supply of the surfactant onto the surface of the substrate ends (step S25). The surfactant may be replaced with a water soluble polymer agent. The pure water may be replaced with a chemical solution.

Figure 10:
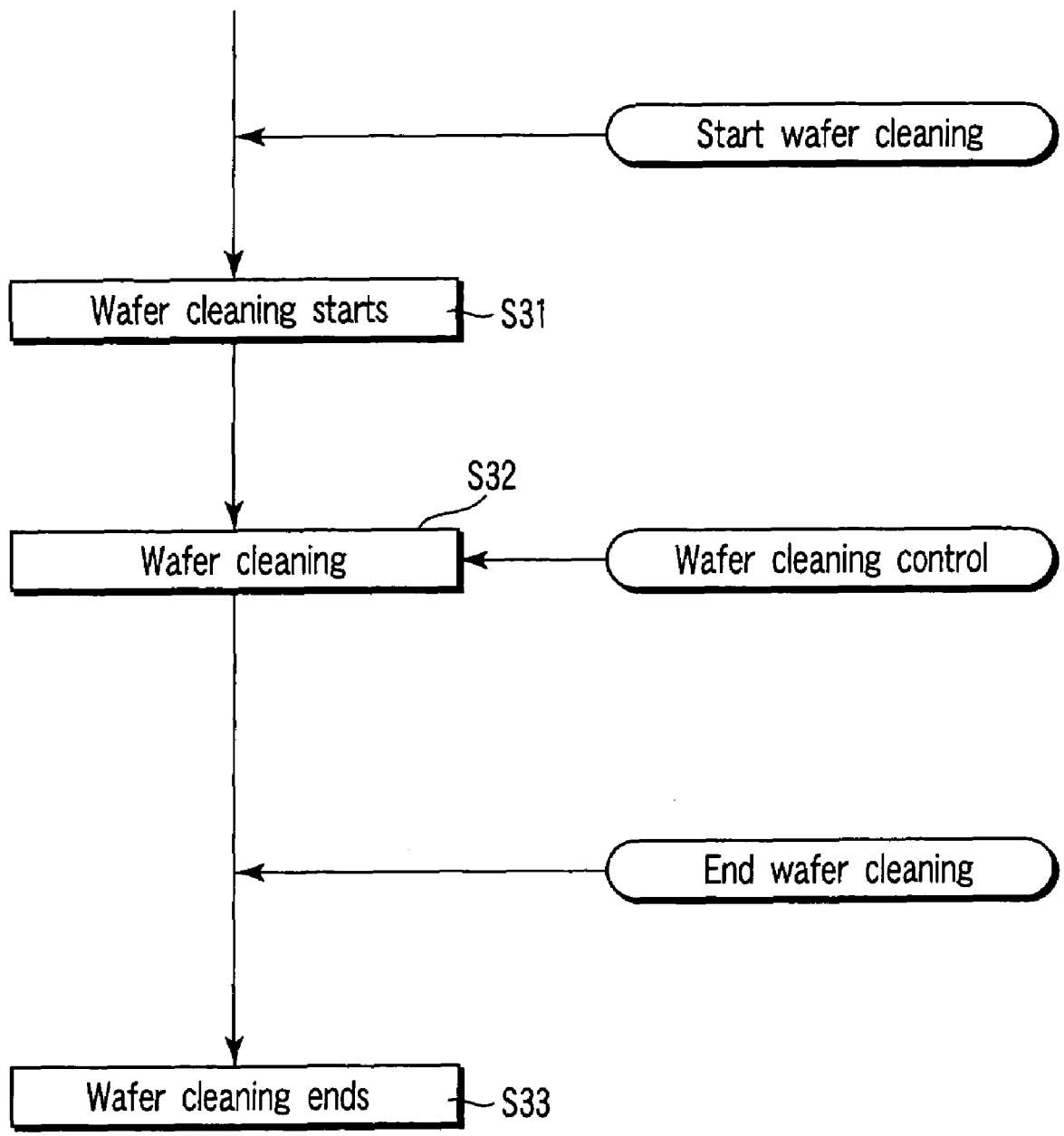
FIG. 10 is a flow chart of cleaning a substrate carried out following the process flows shown in FIGS. 8 and 9.

FIG. 10 is a flow chart of cleaning a substrate carried out following the process flows shown in FIGS. 8 and 9.

As shown in FIG. 10, after polishing the wafer (FIGS. 8 and 9), the control section issues a cleaning start instruction. In accordance with the cleaning start instruction, a wafer cleaning starts (step S31). During the wafer cleaning (step S32), cleaning parameters are controlled by the control section. The control section issues a cleaning end instruction. In accordance with the cleaning end instruction, the wafer cleaning ends (step S33).

According to the above embodiment, in polishing a circumferential portion of a substrate to be processed, a surfactant or a water soluble polymer agent is supplied onto the substrate surface in advance, thereby coating of the surfactant or the water soluble polymer agent is carried out onto the substrate surface, this makes it possible to prevent particles from firmly adhering onto the substrate surface. Accordingly, particles may be easily removed from the substrate surface by a physical cleaning process or the like after polishing process, so that the substrate surface is made free of particles, or nearly free thereof. Therefore, it is possible to improve the reliability and yield of a semiconductor device to be manufactured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of processing a substrate, comprising:
applying a surfactant or a water soluble polymer agent onto a surface of a substrate to be processed to form a hydrophilic film on the surface of the substrate; and
sliding a circumferential portion of the substrate and a polishing member against each other to polish the circumferential portion of the substrate.

2. A method of processing a substrate, according to claim 1, wherein a substrate whose surface except the circumferential portion is protected with an organic film after a predetermined process is carried out, is used as the substrate to be processed.

3. A method of processing a substrate, according to claim 2, wherein at least a portion of the organic film is removed after the circumferential portion of the substrate is polished.

4. A method of processing a substrate, according to claim 3, wherein the surface of the substrate to be processed is cleaned before the at least a portion of the organic film is removed.

5. A method of processing a substrate, according to claim 2, wherein the organic film is made of resist.

6. A method of processing a substrate, according to claim 1, wherein a polishing tape, a polishing pad or a polishing cloth is used as a polishing member.

7. A method of processing a substrate in which a polishing member is contacted and pressed onto a circumferential portion of a substrate to be processed, while the substrate is rotated by rotating a substrate holding portion which holds the substrate thereon, and pure water or chemical solution is supplied onto a contact portion between the circumferential portion of the substrate and the polishing member, to polish the circumferential portion of the substrate, the method comprising:
applying a surfactant or a water soluble polymer agent onto a surface of the substrate to be processed in advance to form a hydrophilic film on the surface of the substrate.

8. A method of processing a substrate, according to claim 7, wherein, to apply the surfactant or the water soluble polymer agent onto the surface of the substrate, the surfactant or the water soluble polymer agent is supplied on a center of the surface of the substrate, followed by rotating the substrate holding portion which holds the substrate thereon.

9. A method of processing a substrate, according to claim 8, wherein, to apply the surfactant or the water soluble polymer agent onto the surface of the substrate, the surfactant or the water soluble polymer agent is continuously or intermittently further supplied, during polishing the circumferential portion of the substrate, onto the center of the surface of the substrate being rotated by rotating the substrate holding portion.

10. A method of processing a substrate, according to claim 7, wherein, to apply the surfactant or the water soluble polymer agent onto the surface of the substrate, the surfactant or the water soluble polymer agent is supplied onto a center of the surface of the substrate, in a state where the substrate is rotated by rotating the substrate holding portion.

11. A method of processing a substrate, according to claim 10, wherein, to apply the surfactant or the water soluble polymer agent onto the surface of the substrate, the surfactant or the water soluble polymer agent is continuously or intermittently further supplied, during polishing the circumferential portion of the substrate, onto the center of the surface of the substrate being rotated by rotating the substrate holding portion.

12. A method of processing a substrate, according to claim 7, wherein the pure water or the chemical solution is supplied, during polishing the circumferential portion of the substrate, onto the center of the surface of the substrate being rotated by rotating the substrate holding portion to be guided onto the contact portion between the circumferential portion of the substrate and the polishing member by centrifugal force generated by the rotation of the substrate holding portion.

13. A method of processing a substrate, according to claim 7, wherein the pure water or the chemical solution is supplied, during polishing the circumferential portion of the substrate, onto the circumferential portion of the substrate being rotated by rotating the substrate holding portion at upstream side in the rotating direction of the contact portion between the circumferential portion of the substrate and the polishing member.

14. A method of processing a substrate, according to claim 7, wherein a substrate whose surface except the circumferential portion is protected with an organic film after a predetermined process is carried out, is used as the substrate to be processed.

15. A method of processing a substrate, according to claim 14, wherein at least a portion of the organic film is removed after the circumferential portion of the substrate is polished.

16. A method of processing a substrate, according to claim 15, wherein the surface of the substrate to be processed is cleaned, before the at least a portion of the organic film is removed.

17. A method of processing a substrate, according to claim 14, wherein the organic film is made of resist.

18. A method of processing a substrate, according to claim 7, wherein a polishing tape, a polishing pad or a polishing cloth is used as a polishing member.

* * * * *